(12) United States Patent
Yan et al.

(10) Patent No.: US 12,506,252 B2
(45) Date of Patent: Dec. 23, 2025

(54) FAN-OUT PACKAGE STRUCTURE AND FABRICATION METHOD THEREFOR

(71) Applicant: Institute of Semiconductors, Guangdong Academy of Sciences, Guangdong (CN)

(72) Inventors: Yingqiang Yan, Guangdong (CN); Chuan Hu, Guangdong (CN); Wei Zheng, Guangdong (CN); Yunzhi Ling, Guangdong (CN); Zhikuan Chen, Guangdong (CN); Zhitao Chen, Guangdong (CN)

(73) Assignee: Institute of Semiconductors, Guangdong Academy of Sciences, Guangdong (CN)

( * ) Notice: Subject to any disclaimer, the term of this patent is extended or adjusted under 35 U.S.C. 154(b) by 120 days.

(21) Appl. No.: 18/624,251

(22) Filed: Apr. 2, 2024

(65) Prior Publication Data
US 2024/0283132 A1 Aug. 22, 2024

Related U.S. Application Data

(63) Continuation of application No. PCT/CN2022/127016, filed on Oct. 24, 2022.

(51) Int. Cl.
*H01Q 1/22* (2006.01)
*H01L 21/56* (2006.01)
(Continued)

(52) U.S. Cl.
CPC .......... *H01Q 1/2283* (2013.01); *H01L 21/568* (2013.01); *H01L 23/3121* (2013.01);
(Continued)

(58) Field of Classification Search
CPC ............ H01Q 1/38; H01Q 1/46; H01Q 1/526; H01Q 1/2283; H01Q 9/045; H01Q 9/0442;
(Continued)

(56) References Cited

U.S. PATENT DOCUMENTS 10,490,880 B2 * 11/2019 Lasiter ............... H01Q 1/46
11,043,730 B2 * 6/2021 Liu ................. H01L 23/5386
(Continued)

FOREIGN PATENT DOCUMENTS

CN 108962773 A 7/2018
CN 113192903 A 7/2021
(Continued)

OTHER PUBLICATIONS

Machine Translation of CN108962773, Jul. 12, 2018, Ren Yulong, et al., 9 pages.
(Continued)

*Primary Examiner* — Tung X Le
(74) *Attorney, Agent, or Firm* — Gunther J. Evanina; BUTZEL LONG; Gunther Evanina

(57) ABSTRACT

A fan-out package structure and a fabricating method therefor are provided. The structure includes an encapsulation layer; an antenna RF module assembly and electronic component(s) embedded in the encapsulation layer; a first rewiring layer on a surface of a first side of the encapsulation layer, electrically connected to at least part of the pins of the assembly and to at least part of the pins of the electronic component(s); a second rewiring layer on a surface of a second side of the encapsulation layer, electrically connected to the encapsulation layer-interconnection conductive pillars and to the conductive solder balls/bumps; and conductive solder balls/bumps on a side of the second rewiring layer away from the encapsulation layer. The assembly includes a RF substrate, and an antenna array and RF device(s) arranged thereon. The assembly is embedded in the first side. Encapsulation-layer interconnection conductive pillars are formed in the encapsulation layer.

20 Claims, 7 Drawing Sheets

(51) Int. Cl.
 *H01L 23/00* (2006.01)
 *H01L 23/31* (2006.01)
 *H01L 23/538* (2006.01)
 *H01L 25/065* (2023.01)

(52) U.S. Cl.
 CPC .......... *H01L 23/5389* (2013.01); *H01L 24/24* (2013.01); *H01L 24/82* (2013.01); *H01L 25/0655* (2013.01); *H01L 2224/24137* (2013.01); *H01L 2224/821* (2013.01)

(58) Field of Classification Search
 CPC .. H01Q 21/065; H01Q 21/0087; H01L 21/50; H01L 21/56; H01L 21/58; H01L 23/64; H01L 23/66; H01L 23/367; H01L 23/3121; H01L 23/3128; H01L 23/5389; H01L 24/20; H01L 24/24; H01L 24/82; H01L 25/0655
 See application file for complete search history.

(56) References Cited

U.S. PATENT DOCUMENTS

| | | | | |
|---|---|---|---|---|
| 11,569,563 | B2* | 1/2023 | Lee | H01Q 9/0414 |
| 11,652,273 | B2* | 5/2023 | Liu | H01Q 9/0407 |
| | | | | 343/795 |
| 12,212,064 | B2* | 1/2025 | Rahman | H01Q 1/02 |
| 2012/0062439 | A1* | 3/2012 | Liao | H01L 23/481 |
| | | | | 29/25.01 |
| 2016/0218072 | A1 | 7/2016 | Liao et al. | |
| 2018/0145033 | A1* | 5/2018 | Yi | H01L 23/5384 |

FOREIGN PATENT DOCUMENTS

| | | |
|---|---|---|
| CN | 113257778 A | 8/2021 |
| CN | 114975409 A | 8/2022 |

OTHER PUBLICATIONS

Machine Translation of CN113192903, Jul. 30, 2021, Hu Zhengxun, et al., 11 pages.
Machine Translation of CN113257778A, Aug. 13, 2021, Yang Guojiang, et al., 12 pages.
Machine Translation of CN114975409A, Aug. 30, 2022, Chen Yanheng, et al., 14 pages.
International Search Report of PCTCN2022127016, dated Jun. 19, 2023, 3 pages.
English Translation of International Search Report of PCTCN2022127016, dated Jun. 19, 2023, 3 pages.
Written Opinion of The International Searching Authority of PCTCN2022127016, dated Jun. 19, 2023, 3 pages.
English Translation of Written Opinion of The International Searching Authority of PCTCN2022127016, dated Jun. 19, 2023, 3 pages.

* cited by examiner

```
┌─────────────────────────────────────────────────────────────────────────┐
│ Manufacturing an antenna RF module assembly, wherein the antenna RF module assembly │
│ includes a RF substrate, and an antenna array and one or more RF devices arranged on the RF │─── S101
│ substrate                                                               │
└─────────────────────────────────────────────────────────────────────────┘
                                    ↓
┌─────────────────────────────────────────────────────────────────────────┐
│ Providing a temporary carrier plate, and forming a peelable adhesive material on the temporary │─── S103
│ carrier plate to cover a side of the temporary carrier plate            │
└─────────────────────────────────────────────────────────────────────────┘
                                    ↓
┌─────────────────────────────────────────────────────────────────────────┐
│ Sticking a side of the RF substrate where the antenna array is arranged, to the peelable adhesive │
│ material, so that the antenna RF module assembly is adhered to the temporary carrier plate via the │─── S105
│ peelable adhesive material                                              │
└─────────────────────────────────────────────────────────────────────────┘
                                    ↓
┌─────────────────────────────────────────────────────────────────────────┐
│ Providing one or more electronic components, and sticking functional surfaces of the one or more │
│ electronic components to the temporary carrier plate via the peelable adhesive material, so that │
│ pins of the antenna RF module assembly which are provided to be located on a same side of the │─── S107
│ RF substrate as the antenna array and pins of the electronic components are arranged in a same │
│ plane and connected to a same surface of the temporary carrier plate    │
└─────────────────────────────────────────────────────────────────────────┘
                                    ↓
┌─────────────────────────────────────────────────────────────────────────┐
│ Forming an encapsulation layer on a side of the peelable adhesive material facing away from the │
│ temporary carrier plate and on a side of the RF substrate where the RF device is arranged, so │─── S109
│ as to embed the antenna RF module assembly and the one or more electronic components in │
│ the encapsulation layer                                                 │
└─────────────────────────────────────────────────────────────────────────┘
                                    ↓
┌─────────────────────────────────────────────────────────────────────────┐
│ Removing the temporary carrier plate and the peelable adhesive material to completely expose │
│ the antenna array from a first side of the encapsulation layer, and expose the pins of the antenna │
│ RF module assembly which are provided to be located on the same side of the RF substrate as │─── S111
│ the antenna array and the pins of the electronic components from the first side of the │
│ encapsulation layer                                                     │
└─────────────────────────────────────────────────────────────────────────┘
                                    ↓
┌─────────────────────────────────────────────────────────────────────────┐
│      Constructing a first rewiring layer on a surface of the first side of the encapsulation layer │─── S113
└─────────────────────────────────────────────────────────────────────────┘
                                    ↓
┌─────────────────────────────────────────────────────────────────────────┐
│ Forming via holes in the encapsulation layer, wherein the via holes extend from a second side of │
│ the encapsulation layer opposite to the first side to pins of the antenna RF module assembly │─── S115
│ which are arranged on a side of the RF substrate opposite to the antenna array and/or conductive │
│ pins of the first rewiring layer                                        │
└─────────────────────────────────────────────────────────────────────────┘
                                    ↓
┌─────────────────────────────────────────────────────────────────────────┐
│ Filling a conductive material in the via holes to form the encapsulation-layer interconnection │─── S117
│ conductive pillars in the encapsulation layer                           │
└─────────────────────────────────────────────────────────────────────────┘
                                    ↓
┌─────────────────────────────────────────────────────────────────────────┐
│ Constructing a second rewiring layer on a surface of the second side of the encapsulation layer, │
│ and forming conductive solder balls or bumps on a side of the second rewiring layer facing away │─── S119
│ from the encapsulation layer                                            │
└─────────────────────────────────────────────────────────────────────────┘
```

FIG. 2

FAN-OUT PACKAGE STRUCTURE AND FABRICATION METHOD THEREFOR

CROSS-REFERENCE TO RELATED APPLICATIONS

The present application is a continuation under 35 USC § 120 of the International Patent Application No. PCT/CN2022/127016, filed on Oct. 24, 2022, the contents of which are incorporated herein by reference its entirety.

TECHNICAL FIELD

The present disclosure relates to the technical field of advanced electronic device integration/packaging. More particularly, the present disclosure relates to a fan-out package structure and a method for fabricating the fan-out package structure.

BACKGROUND ART

At present, for the 5G/6G communication radio frequency (RF) module, it is required to integrate an antenna (such as a millimeter wave antenna) with a RF chip, a power amplifier, an equipment switch chip, etc. to form a RF transceiver module. The traditional integration method is to electrically connect the processed antenna array with the packaged RF chip. The disadvantage of the traditional integration method is that the RF chip is a packaged device before it is electrically connected to the antenna array, which will inevitably lead to the large volume and high cost of the 5G/6G communication RF module, and the interconnection line between the chip and the antenna is too long, resulting in large dielectric loss, which cannot meet the requirements of high-frequency signal transmission.

SUMMARY

Embodiments of the present disclosure provide a fan-out package structure, which may include: an encapsulation layer, and an antenna RF module assembly and one or more electronic components embedded in the encapsulation layer, wherein the antenna RF module assembly includes a RF substrate, and an antenna array and one or more RF devices arranged on the RF substrate, the antenna RF module assembly is embedded in a first side of the encapsulation layer, so that the antenna array is completely exposed from the first side of the encapsulation layer, and pins of the antenna RF module assembly which are provided to be located on a same side of the RF substrate as the antenna array and pins of the electronic components are located in a same plane. The fan-out package structure may further include: a first rewiring layer provided on a surface of the first side of the encapsulation layer, a second rewiring layer provided on a surface of a second side of the encapsulation layer opposite to the first side, and conductive solder balls and/or bumps provided on a side of the second rewiring layer facing away from the encapsulation layer, wherein the first rewiring layer has an opening configured to completely expose the antenna array, and the first rewiring layer is configured to be electrically connected to at least part of the pins of the antenna RF module assembly which are provided to be located on the same side of the RF substrate as the antenna array, and electrically connected to at least part of the pins of one or more electronic components, encapsulation-layer interconnection conductive pillars configured to make pins of the antenna RF module assembly arranged on a side of the RF substrate opposite to the antenna array electrically connected to the second rewiring layer and the first rewiring layer electrically connected to the second rewiring layer are formed in the encapsulation layer, and the second rewiring layer is configured to be electrically connected to the encapsulation-layer interconnection conductive pillars and electrically connected to the conductive solder balls and/or bumps.

Embodiments of the present disclosure further provide a method for fabricating a fan-out package structure, which includes the following steps: manufacturing an antenna RF module assembly, wherein the antenna RF module assembly includes a RF substrate, and an antenna array and one or more RF devices arranged on the RF substrate; providing a temporary carrier plate, and forming a peelable adhesive material on the temporary carrier plate to cover a side of the temporary carrier plate; sticking, to the peelable adhesive material, a side of the RF substrate where the antenna array is arranged, so that the antenna RF module assembly is adhered to the temporary carrier plate via the peelable adhesive material; providing one or more electronic components, and sticking functional surfaces of the one or more electronic components to the temporary carrier plate via the peelable adhesive material, so that pins of the antenna RF module assembly which are provided to be located on a same side of the RF substrate as the antenna array and pins of the electronic components are located in a same plane and connected to a same surface of the temporary carrier plate; forming an encapsulation layer on a side of the peelable adhesive material facing away from the temporary carrier plate and on a side of the RF substrate where the RF device is arranged, so as to embed the antenna RF module assembly and the one or more electronic components in the encapsulation layer; removing the temporary carrier plate and the peelable adhesive material, to completely expose the antenna array from a first side of the encapsulation layer, and expose, from the first side of the encapsulation layer, the pins of the antenna RF module assembly which are provided to be located on the same side of the RF substrate as the antenna array and the pins of the electronic components; constructing a first rewiring layer on a surface of the first side of the encapsulation layer, wherein the first rewiring layer is provided with an opening to completely expose the antenna array, and is configured to be electrically connected to at least part of the pins of the antenna RF module assembly which are provided to be located on the same side of the RF substrate as the antenna array, and electrically connected to at least part of the pins of one or more electronic components; forming via holes in the encapsulation layer, wherein the via holes extend from a second side of the encapsulation layer opposite to the first side to pins of the antenna RF module assembly which are arranged on a side of the RF substrate opposite to the antenna array and/or conductive pins of the first rewiring layer; filling a conductive material in the via holes to form the encapsulation-layer interconnection conductive pillars in the encapsulation layer; and constructing a second rewiring layer on a surface of the second side of the encapsulation layer, and forming conductive solder balls and/or bumps on a side of the second rewiring layer facing away from the encapsulation layer, so that the second rewiring layer and the encapsulation-layer interconnection conductive pillars are electrically connected to each other, and are electrically connected to the conductive solder balls and/or bumps.

BRIEF DESCRIPTION OF DRAWINGS

In order to illustrate the technical solutions of the present disclosure more clearly, the drawing which needs to be used will be briefly introduced below. It is to be understood that the drawings only show some implementations of the present disclosure, so they shall not be regarded as limiting the scope. For a person ordinarily skilled in the art, other relevant drawings may be obtained in light of the drawings without any creative effort.

FIG. 2 is a schematic flowchart showing a fabricating method for fabricating a fan-out package structure according to exemplary embodiments of the present disclosure;

Figure 1:
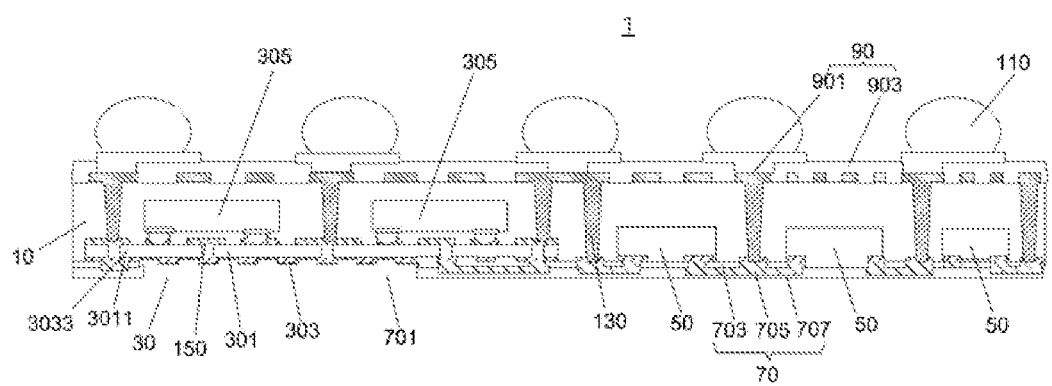
FIG. 1 is a schematic cross-sectional view of a fan-out package structure according to exemplary embodiments of the present disclosure.

Reference numerals: fan-out package structure 1; encapsulation layer 10; antenna RF module assembly 30; electronic component 50; RF substrate 301; antenna array 303; RF device 305; first rewiring layer 70; second rewiring layer 90; conductive solder ball and/or bump 110; encapsulation-layer interconnection conductive pillar 130; assembly rewiring layer 150; grounding layer or electromagnetic shielding layer 170; first wiring dielectric layer 703; first conductive wiring layer 705; first protective dielectric layer 707; second conductive wiring layer 901; second wiring dielectric layer 903; inter-pillar interconnection line 9011; pillar-ball interconnection line 9013; first surface 3011; and second surface 3033.

DETAILED DESCRIPTION OF EMBODIMENTS

The present disclosure will be described in detail by means of exemplary embodiments with reference to the drawings. It should be noted that the following detailed description of the present disclosure is for illustration purpose only and shall not constitute a limitation on the present disclosure. In addition, the same reference numerals are used in the drawings to indicate the same parts.

It should also be noted that for the sake of clarity, not all features of actual specific embodiments are described and shown in the specification and drawings, and in order to avoid unnecessary details from obscuring the technical solutions concerned by the present disclosure, only the device structure closely related to the technical solutions of the present disclosure is described and shown in the drawings and specifications, while other details that are less related to the technical content of the present disclosure and are known to those skilled in the art are omitted.

Next, a fan-out package structure and a method for fabricating a fan-out package structure provided according to exemplary embodiments of the present disclosure will be described in detail with reference to the drawings.

Next, a fan-out package structure 1 according to an exemplary embodiment of the present disclosure will be described with reference to FIG. 1. FIG. 1 shows a schematic cross-sectional view of a fan-out package structure 1 according to exemplary embodiments of the present disclosure. As shown in FIG. 1, in the embodiment of the present disclosure, the fan-out package structure 1 includes an encapsulation layer 10, an antenna RF module assembly 30 embedded in the encapsulation layer 10, and one or more electronic components 50 embedded in the encapsulation layer 10. The antenna RF module assembly 30 may include a RF substrate 301, an antenna array 303 and one or more RF devices 305. The antenna array 303 and one or more RF devices 305 are arranged on the RF substrate 301. In the embodiment of the present disclosure, the antenna RF module assembly 30 may be embedded in the first side of the encapsulation layer 10, so that the antenna array 303 and its pins may be completely exposed from the first side of the encapsulation layer 10. The pins of the antenna RF module assembly 30 which are provided to be located on the same side of the RF substrate 301 as the antenna array 303 may be located in the same plane as the pins of the electronic components 50.

In the embodiment of the present disclosure, as shown in FIG. 1, the fan-out package structure 1 further includes a first rewiring layer 70 provided on the surface of the first side of the encapsulation layer 10, a second rewiring layer 90 provided on the surface of the second side of the encapsulation layer 10 opposite to the first side, and conductive solder balls and/or bumps 110 provided on the side of the second rewiring layer 90 facing away from the encapsulation layer 10. The first rewiring layer 70 may have an opening that completely exposes the antenna array 303 and thus fully exposed from the entire package structure 1. The first rewiring layer 70 may be configured to be electrically connected to some or all of the pins of the antenna RF module assembly 30 which are provided to be located on the same side of the RF substrate 301 as the antenna array 303, and may be configured to be electrically connected to some or all of the pins of the one or more electronic components 50. In some embodiments, the first rewiring layer 70 may be configured to make the pins of the antenna RF module assembly 30 which are provided to be located on the same side of the RF substrate 301 as the antenna array 303 electrically connected to the pins of the one or more electronic components 50, and may be configured to make the pins of the electronic components 50 electrically connected to each other. In the embodiment of the present disclosure, encapsulation-layer interconnection conductive pillars 130 for making the pins of the antenna RF module assembly 30 which are arranged on the side of the RF substrate 301 opposite to the antenna array 303 electrically connected to the second rewiring layer 90 and making the first rewiring layer 70 electrically connected to the second rewiring layer 90 may also be formed in the encapsulation layer 10. The second rewiring layer 90 may be configured to be electrically connected to the interconnection conductive pillars 130 as well as the conductive solder balls and/or bumps. In some embodiments, the second rewiring layer 90 may be configured to make the encapsulation-layer interconnection conductive pillars 130 electrically connected to each other and the encapsulation-layer interconnection conductive pillars 130 electrically connected with conductive solder balls and/or bumps.

According to the fan-out package structure 1 provided by the embodiment of the present disclosure, the antenna array 303 is packaged together with the RF device 305 and one or more other electronic components 50, so that the volume of the communication RF module and the manufacturing cost of the communication RF module can be reduced. In addition, according to the fan-out package structure provided by the embodiment of the present disclosure, by packaging the antenna array 303 with the RF device 305 and other electronic components 50 such as integrated circuits, switching devices and/or power amplifiers, required by communication RF modules, the length of interconnection lines between them can be significantly shortened, and the dielectric loss can be significantly reduced, so that the transmission requirements of high-frequency signals can be well met. Therefore, the fan-out package structure provided by the embodiment of the present disclosure can effectively reduce the volume of the RF module, reduce the manufacturing cost of the RF module, and obviously reduce the dielectric loss to meet the requirements of high-frequency signal transmission, so it has excellent performance.

In some embodiments of the present disclosure, one or more RF devices 305 in the antenna RF module assembly 30 may be RF chips. The antenna array 303 may be electrically connected to the RF chips, so as to be driven and controlled thereby.

In some embodiments, the electronic component is selected from the following: a passive device, a processor, a memory, a controller, a sensor, and a power management chip; and/or the RF device includes one or more of a switching device, a power amplifier, a low noise amplifier and a filter.

In some embodiments of the present disclosure, the one or more electronic components 50 may be non-RF devices, such as passive devices, processors, memories, controllers, sensors and/or power management chips. However, it should be noted that this does not exclude that in some embodiments of the present disclosure, the one or more electronic components 50 may further include RF devices.

In the embodiment of the present disclosure, the antenna array 303 in the antenna RF module assembly 30 may be a 5G or 6G antenna array. The antenna array 303 may be an antenna array applied to the MIMO (Multiple Input Multiple Output) technology. However, this does not exclude that in some embodiments, the antenna array 303 may also be an antenna interface.

In some embodiments of the present disclosure, the antenna array 303 may be replaced by an antenna connector, so that the antenna connector is arranged on the RF substrate. In such an embodiment, the antenna array may be connected to a connection end provided by the antenna connector arranged in the package structure.

It should also be noted that the RF device 305 in the antenna RF module assembly 30 referred to in the present disclosure is non-limiting in structure and function. Without departing from the spirit and scope of the present disclosure, any suitable RF device may be embedded in the fan-out package structure of the present disclosure.

In addition, in some embodiments of the present disclosure, when one or more RF devices 305 in the antenna RF module assembly 30 are one or more RF chips, conductive connection parts, such as pins, of the RF chips may be arranged on a side of the RF chips facing the RF substrate 301, so that the RF chips are wire-bonded on the RF substrate 301. In other embodiments, the conductive connection parts may be arranged on the other sides of the RF chips opposite to the side facing the RF substrate 301, so that the RF chips may be flipped on the RF substrate 301 (i.e., the RF chips may be flip-chips on the RF substrate).

Of course, the RF device 305 in the antenna RF module assembly 30 provided by the embodiment of the present disclosure is not limited to the RF chip. In some embodiments, the embedded RF device 305 may also be another fan-out package in which RF devices required by the RF module have been packaged. It should also be noted that according to the embodiment of the present disclosure, the number and/or functions of the RF devices 305 in the antenna RF module assembly 30 are also not limited. In some embodiments, for the RF device 305 included in the antenna RF module assembly 30, there may be a single RF device 305, or there may be two or more RF devices 305. In some embodiments, when the antenna RF module assembly 30 includes two or more RF devices 305, the dimensions, fabrication processes, functions, and/or materials of these RF devices 305 may be the same or different. Similarly, the number and/or functions of the electronic components 50 embedded in the fan-out package structure are not limited. In some embodiments, for the embedded electronic component 50, there may be a single electronic component 50, or there may be two or more electronic components 50. In some embodiments, when two or more electronic components 50 are embedded in the fan-out package structure, the dimensions, fabrication processes, functions, and/or materials of these electronic components 50 may be the same or different, depending on the specific application.

It should be noted that in the embodiment of the present disclosure, the connection relationship between the antenna RF module assembly 30 and the one or more electronic components 50 is not limited to the above description, but the connection relationship between the antenna array 303 in the antenna RF module assembly 30, and one or more RF devices 305 and one or more electronic components 50 in the antenna RF module assembly 30 may be designed according to the specific functional requirements of the fan-out package. In some embodiments, the antenna array 303 may be electrically connected to one or more RF devices 305 through an interconnection line arranged on the RF substrate 301, so as to be controlled and driven by them. In some embodiments, the pins of the antenna array 303 and the electrical connection parts of the RF devices may be electrically connected by through holes provided on the RF substrate 301. In some embodiments, there is no electrical connection between the antenna array 303 and the electronic components 50, that is, the pins of the antenna RF module assembly 30 which are provided to be located on the same side of the RF substrate 301 as the antenna array 303 and the pins of the one or more electronic components 50 are not electrically connected to each other, but are electrically connected to only the RF device 305. However, this does not exclude that, in some embodiments, the antenna array 303 and the RF devices 305 may, as required, be designed to have no direct electrical connection to each other, but to be electrically connected to devices outside the package structure through a packaged line.

In some embodiments, the antenna RF module assembly further includes an assembly rewiring layer provided between the one or more RF devices and the RF substrate, and the assembly rewiring layer includes an assembly conductive wiring layer that electrically connects pins of the one or more RF devices to pins of the antenna RF module assembly provided on the second surface of the RF substrate.

In the embodiment of the present disclosure, as shown in FIG. 1, an assembly rewiring layer 150 is optionally provided between the RF substrate 301 of the antenna RF module and the RF devices 305. The RF devices 305 may be electrically connected to the RF substrate 301 through the assembly rewiring layer. In some embodiments, the pins of the antenna array 303 may form an electrical connection to the assembly rewiring layer 150, and thus form an electrical connection to the RF devices 305. In some embodiments, the assembly rewiring layer 150 may include one or more layers. In some embodiments, the assembly rewiring layer 150 includes a plurality of layers of interconnection lines and insulating layers each provided between corresponding adjacent layers of interconnection lines. In some embodiments, the interconnection line may be made of copper, and the insulating layer may be made of polyimide, epoxy resin and other materials.

In the embodiment of the present disclosure, as a non-limiting example, as shown in FIG. 1, the first rewiring layer 70 may include a first wiring dielectric layer 703 adjacent to the encapsulation layer 10, a first protective dielectric layer 707 provided on a side of the first wiring dielectric layer 703 facing away from the encapsulation layer 10, and a first conductive wiring layer 705 embedded in the first wiring dielectric layer 703 and the first protective dielectric layer 707. The first conductive wiring layer 705 may include at least one layer of interconnection line, and when two or more layers of interconnection lines are included, the first conductive wiring layer further includes isolation dielectric layer(s) each located between two adjacent layers of interconnection lines. The first conductive wiring layer 705 may include an interconnection line for being electrically connected to encapsulation-layer interconnection conductive pillars, an interconnection line for being electrically connected to at least part of pins of the antenna RF module assembly which are provided to be located on the same side of the RF substrate as the antenna array, and an interconnection line for being electrically connected to at least part of the pins of one or more electronic components. In some embodiments, the first conductive wiring layer 705 may include an antenna-electronic component interconnection line for making the pins of the antenna RF module assembly 30 which are provided to be located on the same side of the RF substrate 301 as the antenna array 303 electrically connected with the pins of one or more electronic components 50, and an inter-electronic component interconnection line for making pins of at least two of the electronic components 50 electrically connected to each other.

In the embodiment of the present disclosure, as a non-limiting example, the second rewiring layer 90 may include a second wiring dielectric layer 903 and a second conductive wiring layer 901 embedded in the second wiring dielectric layer 903 and formed as passing through the second wiring dielectric layer 903. The second conductive wiring layer 901 may include at least one layer of interconnection line, and when two or more layers of interconnection lines are included, the second conductive wiring layer further includes isolation dielectric layer(s) each located between corresponding two adjacent layers of interconnection lines. The second conductive wiring layer 901 may include an interconnection line arranged adjacent to the encapsulation layer for being electrical connected to the encapsulation-layer interconnection conductive pillars, and an interconnection line for being electrical connected to conductive solder balls and/or bumps. In some embodiments, the second conductive wiring layer 901 may include an inter-pillar interconnection line 9011 provided adjacent to the encapsulation layer 10 for making the encapsulation-layer interconnection conductive pillars 130 electrically connected to each other, and a pillar-ball interconnection line 9013 for making the encapsulation-layer interconnection conductive pillars 130 electrically connected to the conductive solder balls and/or bumps 110.

In the embodiment of the present disclosure, the dielectric material in the RF substrate may be a material with good RF characteristics, such as LCP, glass, etc. The RF substrate 301 may be, for example, an LCP (liquid crystal polymer) RF substrate 301. The LCP material is a new type of thermoplastic organic material, which may ensure high-frequency and high-speed transmission under the premise of high reliability. The LCP material has good electrical properties.

For example, it can maintain a basically constant dielectric constant in the full RF range up to 110 GHz; secondly, it has small tangent loss, only 0.002, and the tangent loss only increases to 0.0045 even at 110 GHz, which is suitable for millimeter wave applications; and thirdly, it has small thermal expansion characteristics and can be used as an ideal high-frequency packaging material. These electrical properties enable LCP soft boards to be used in terminal antennas to cope with the gradual shift to high-frequency and high-speed wireless transmission, especially in millimeter wave applications.

In the embodiment of the present disclosure, the RF substrate 301 includes a first surface 3011 and a second surface 3033 opposite to the first surface 3011. In some embodiments of the present disclosure, as shown in FIG. 1 and FIGS. 6 to 19, the RF substrate 301 may include a first layout area for one or more RF devices 305 on the first surface 3011 and a second layout area for the antenna array 303 on the second surface 3033. Accordingly, one or more RF devices 305 may be arranged in the first layout area, and the antenna array 303 may be arranged in the second layout area. However, it can be understood that, although not shown, in some embodiments of the present disclosure, the first layout area and the second layout area may also be located on the same surface of the RF substrate 301 without any overlapping area.

In the embodiment of the present disclosure, when the antenna array 303 is located on the first surface 3011 and one or more RF devices 305 are located on the second surface 3033, that is, when the first layout area is located on the first surface 3011 and the second layout area is located on the second surface 3033, the first layout area may be aligned with the second layout area in the vertical direction of the RF substrate 301, wherein the vertical direction may be a direction perpendicular to the length direction of the RF substrate 301.

In the embodiment of the present disclosure, when the antenna array 303 is arranged on the first surface 3011 and one or more RF devices 305 are arranged on the second surface 3033, the assembly rewiring layer may be arranged between the one or more RF devices 305 and the second surface 3033 of the RF substrate 301. At this time, the assembly rewiring layer 150 may include an assembly conductive wiring layer that electrically connects the pins of the one or more RF devices 305 to the pins of the antenna RF module assembly 30 provided on the second surface 3033 of the RF substrate 301.

In some embodiments, the antenna RF module assembly further includes a grounding layer and/or an electromagnetic shielding layer arranged on the second surface of the RF substrate.

In some embodiments of the present disclosure, the antenna RF module assembly 30 may be provided with a grounding layer or electromagnetic shielding layer 170 (see FIG. 6) on a side of the RF substrate 301, such as the side where the RF devices 305 are arranged, to shield possible electromagnetic interference.

In some embodiments, the RF substrate is an LCP RF substrate.

In some embodiments, the area of the opening of the first rewiring layer that completely exposes the antenna array accounts for at least part of the total area of the first rewiring layer. In some embodiments of the present disclosure, the area of the opening of the first rewiring layer 70 that completely exposes the antenna array 303 accounts for a part of the total area of the first rewiring layer 70. In some embodiments of the present disclosure, the area of the opening of the first rewiring layer 70 that completely exposes the antenna array 303 accounts for all of the total area of the first rewiring layer 70.

A fabricating method for fabricating a fan-out package structure according to an embodiment of the present disclosure is described below with reference to FIG. 2. FIG. 2 shows an exemplary flowchart of a method for fabricating a fan-out package structure. As shown in the figure, in the embodiment of the present disclosure, the fabricating method may include the following steps:

Step S101: manufacturing an antenna RF module assembly 30, wherein the antenna RF module assembly includes a RF substrate 301, and an antenna array 303 and one or more RF devices 305 arranged on the RF substrate 301.

Step S103: providing a temporary carrier plate 40, and forming a peelable adhesive material 20 on the temporary carrier plate 40 to cover a side of the temporary carrier plate 40.

Step S105: sticking, to the peelable adhesive material 20, a side of the RF substrate 301 where the antenna array 303 is arranged, so that the antenna RF module assembly 30 is adhered to the temporary carrier plate 40 via the peelable adhesive material 20.

Step S107: providing one or more electronic components 50, and sticking functional surfaces of the one or more electronic components 50 to the temporary carrier plate 40 via the peelable adhesive material 20, so that pins of the antenna RF module assembly 30 which are provided to be located on a same side as the antenna array 303 and pins of the electronic components 50 are located in a same plane and connected to a same surface of the temporary carrier plate 40.

Step S109: forming an encapsulation layer 10 on a side of the peelable adhesive material 20 facing away from the temporary carrier plate 40 and on a side of the RF substrate 301 where the RF devices 305 are arranged, so as to embed the antenna RF module assembly 30 and the one or more electronic components 50 in the encapsulation layer 10.

Step S111: removing the temporary carrier plate 40 and the peelable adhesive material 20 to completely expose the antenna array 303 from a first side of the encapsulation layer 10, and expose, from the first side of the encapsulation layer 10, the pins of the antenna RF module assembly 30 which are provided to be located on the same side of the RF substrate 301 as the antenna array 303 and the pins of the electronic component 50.

Step S113: constructing a first rewiring layer 70 on a surface of the first side of the encapsulation layer 10, wherein the first rewiring layer 70 is provided with an opening configured to completely expose the antenna array 303, and is configured to be electrically connected to encapsulation-layer interconnection conductive pillars, at least part of the pins of the antenna RF module assembly 30 which are provided to be located on the same side of the RF substrate 301 as the antenna array 303, and at least part of the pins of one or more electronic components 50.

Step S115: forming via holes 130' in the encapsulation layer 10, wherein the via holes 130' extend from a second side of the encapsulation layer 10 opposite to the first side to pins of the antenna RF module assembly 30 which are arranged on a side of the RF substrate 301 opposite to the antenna array 303 and/or conductive pins of the first rewiring layer 70.

In this embodiment, the via holes 130' are fabricated in the encapsulation material to expose the internal interconnection pin pads formed by the assembly rewiring layer and the first rewiring layer 70.

In this embodiment, the number of via holes 130' is plural.

In this embodiment, the fabricating process of the via hole 130' is non-limiting. In some embodiments, interconnection via holes 130' may be formed by photolithography (e.g., dry etching process) or drilling (laser drilling).

Step S117: filling a conductive material in the via holes 130' to form the encapsulation-layer interconnection conductive pillars 130 in the encapsulation layer 10.

For example, the conductive material may be filled in the interconnection via holes 130' by sputtering, electroless plating, electroplating, etc. The conductive material filled in the interconnection via holes 130' is also non-limiting. In some embodiments, the conductive material may be copper or a conductive paste such as a nano-silver paste.

Step S119: constructing a second rewiring layer 90 on a surface of the second side of the encapsulation layer 10, and forming conductive solder balls and/or bumps 110 on a side of the second rewiring layer 90 facing away from the encapsulation layer 10, so that the second rewiring layer 90 and the encapsulation-layer interconnection conductive pillars 130 are electrically connected to each other, and are electrically connected to the conductive solder balls and/or bumps 110.

In the fabricating method for fabricating a fan-out package structure provided by the embodiment of the present disclosure, the antenna array 303, the RF devices 305 and one or more other electronic components 50 are packaged together, so that the volume of the communication RF module can be reduced, and the manufacturing cost of the communication RF module can be reduced. In addition, according to the fabricating method for fabricating a fan-out package structure provided by the embodiment of the present disclosure, the antenna array 303 is packaged together with the RF devices 305 and other electronic components 50, such as integrated circuits, switching devices and/or power amplifiers, which are required by communication RF modules, so that the length of interconnection lines between them can be significantly shortened, and the dielectric loss can be significantly reduced, thus the transmission requirements of high-frequency signals can be well met. Therefore, the fabricating method for fabricating a fan-out package structure provided by the embodiment of the present disclosure can effectively reduce the volume of the communication RF module and the manufacturing cost of the communication RF module, and can also significantly reduce the dielectric loss to meet the requirements of high-frequency signal transmission, thus having excellent performance.

Figure 3:
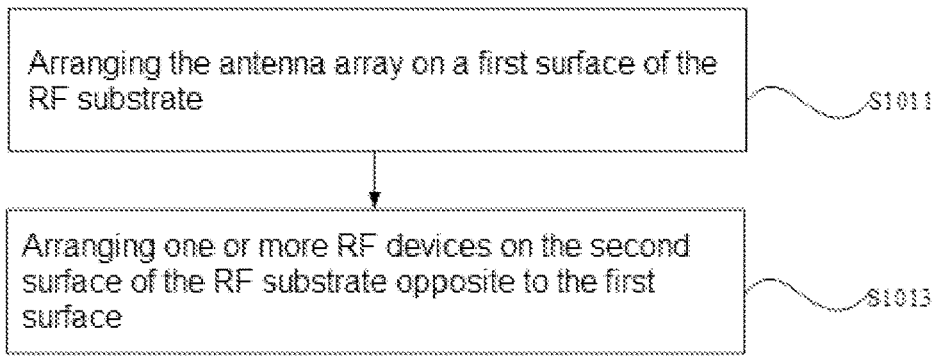
FIGS. 3 to 5 are schematic flowcharts showing optional processes of a fabricating method for fabricating a fan-out package structure according to exemplary embodiments of the present disclosure.

In some embodiments of the present disclosure, as shown in FIG. 3, the above step S101 of fabricating the antenna RF module assembly 30 may include the following sub-steps:

S1011: arranging the antenna array 303 on a first surface 3011 of the RF substrate 301; and S1013: arranging the one or more RF devices 305 on a second surface 3033 of the RF substrate 301 which is opposite to the first surface 3011. In other words, the second surface and the first surface are located on opposite sides of the RF substrate.

In the above, the step of arranging the one or more RF devices 305 on a second surface 3033 of the RF substrate 301 may include: constructing an assembly rewiring layer 150 between the one or more RF devices 305 and the RF substrate 301. The assembly rewiring layer 150 may include an assembly conductive wiring layer for electrically connecting pins of the one or more RF devices 305 to pins of the antenna RF module assembly 30 which are arranged on the second surface 3033 of the RF substrate 301.

In this case, the fan-out package structure obtained by the fabricating method according to the embodiment of the present disclosure includes an assembly conductive wiring layer arranged on the second surface 3033 of the RF substrate 301. One or more RF devices 305 may be electrically connected to the assembly conductive wiring layer arranged on the second surface 3033 of the RF substrate 301, so as to realize the electrical connection to the RF substrate 301.

In some embodiments of the present disclosure, the assembly rewiring layer 150 may include one or more layers. In some embodiments, the assembly rewiring layer includes a plurality of layers of interconnection lines and insulating layer(s) each provided between corresponding adjacent layers of interconnection lines. In some embodiments, the interconnection lines may be made of copper. In some embodiments, the insulating layer may be made of polyimide, epoxy resin and other materials.

Figure 6:
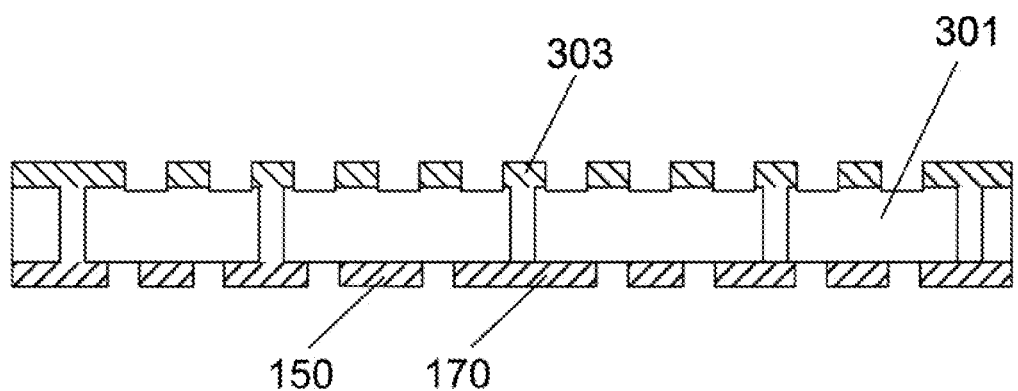
FIGS. 6 to 19 are schematic cross-sectional views of intermediate structures and a final structure obtained in the processes of fabricating a fan-out package structure according to the fabricating method provided by exemplary embodiments of the present disclosure.

In some embodiments of the present disclosure, the step of manufacturing the antenna RF module assembly 30 may further include: forming a grounding layer and/or an electromagnetic shielding layer 170 on the surface of the RF substrate 301 where the RF devices 305 are provided (see FIG. 6).

In some embodiments of the present disclosure, the step of manufacturing the antenna RF module assembly 30 may further include: providing an LCP RF substrate as the RF substrate 301 of the antenna RF module assembly 30.

Figure 4:
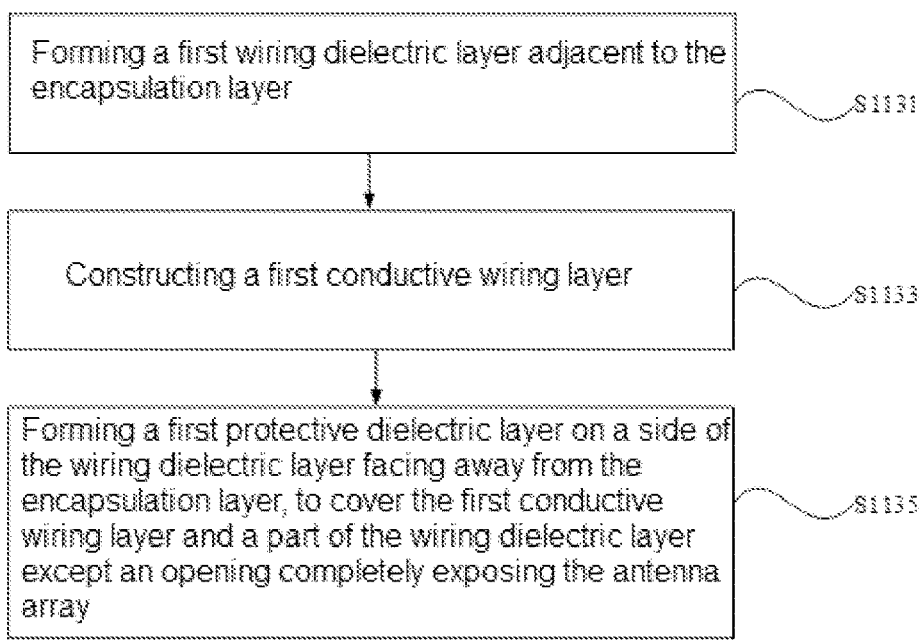

In some embodiments of the present disclosure, as shown in FIG. 4, the above step S113 of constructing the first rewiring layer 70 on the surface of the first side of the encapsulation layer 10 may include the following sub-steps:

S1131: forming a first wiring dielectric layer 703 adjacent to the encapsulation layer 10.

In this embodiment, the first wiring dielectric layer 703 may be formed such that the first wiring dielectric layer 703 has an opening 701 that completely exposes the antenna array 303, and holes of the first wiring dielectric layer that expose pins of the antenna RF module assembly 30 which are provided to be located on the same side of the RF substrate 301 as the antenna array 303 and the pins of one or more electronic components 50.

S1133: constructing the first conductive wiring layer 705.

In this embodiment, a conductive material, such as metal, may be used to fill the holes of the first wiring dielectric layer to form first guiding conductive pillars. Exemplarily, the metal used may be copper. Then, an interconnection line electrically connected to the encapsulation-layer interconnection conductive pillars, an interconnection line electrically connected to at least part of the pins of the antenna RF module assembly which are provided to be located on the same side of the RF substrate as the antenna array, and an interconnection line electrically connected to at least part of the pins of the electronic components may be formed at the ends of the first guiding conductive pillars facing away from the encapsulation layer 10. In some embodiments, an antenna-electronic component interconnection line and an inter-electronic component interconnection line may be formed at the ends of the first guiding conductive pillars facing away from the encapsulation layer 10, wherein the antenna-electronic component interconnection line may be used to make the pins of the antenna RF module assembly 30 which are provided to be located on the same side of the RF substrate 301 as the antenna array 303 electrically connected to the pins of one or more electronic components 50, and the inter-electronic component interconnection line may be used to make the pins of at least two electronic components 50 electrically connected to each other.

In this embodiment, the first conductive wiring layer 705 may be formed by electrocoppering after photolithography or by etching after sputtering.

S1135: forming a first protective dielectric layer 707 on a side of the wiring dielectric layer facing away from the encapsulation layer 10 to cover the first conductive wiring layer 705 and a part of the wiring dielectric layer except the opening 701 completely exposing the antenna array 303.

In this embodiment, the first wiring dielectric layer 703 and the first protective dielectric layer 707 are both insulating layers made of insulating materials.

In other words, the process of rewiring to obtain the first rewiring layer 70 may include: fabricating a first insulating layer on the side of the encapsulation layer 10 close to the antenna array 303, wherein the first insulating layer should be fabricated in such a way as to cover the electronic components 50 and the encapsulation material without shielding the antenna array 303; patterning the first insulating layer so that the pins of the electronic components 50 and the pins of the antenna array 303 are exposed; fabricating a conductive wiring layer on the patterned first insulating layer, so that the electronic components 50 may be connected to the antenna array 303 as required; and fabricating a second insulating layer on the conductive wiring layer to protect it.

Figure 5:
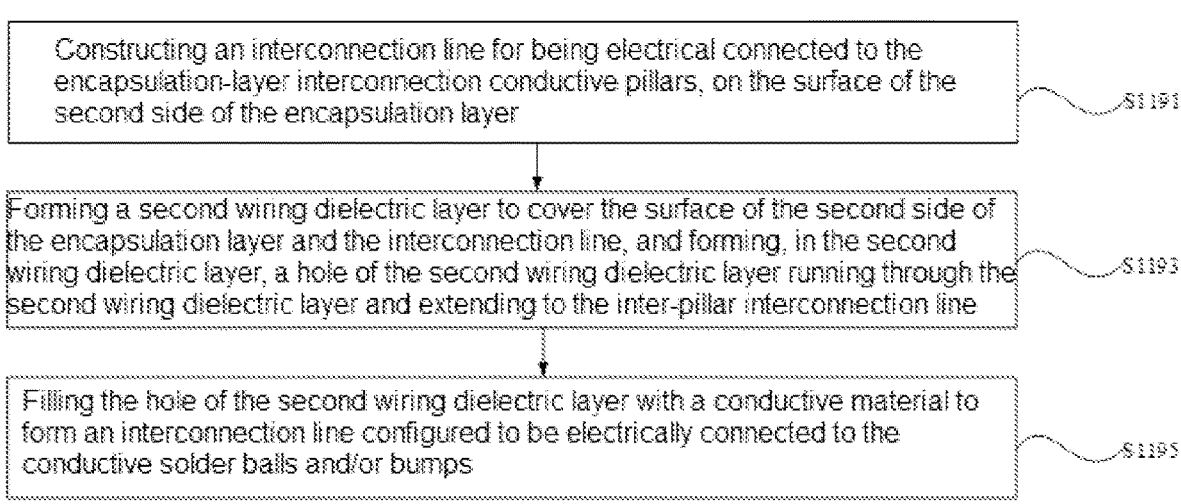

In some embodiments of the present disclosure, as shown in FIG. 5, the above step S119 of constructing the second rewiring layer 90 on the surface of the second side of the encapsulation layer 10 may include the following sub-steps:

S1191: constructing an interconnection line for being electrical connected to the encapsulation-layer interconnection conductive pillars 130, on the surface of the second side of the encapsulation layer 10.

In some embodiments, an inter-pillar interconnection line 9011 for making the encapsulation-layer interconnection conductive pillars 130 electrically connected to each other may be constructed on the surface of the second side of the encapsulation layer 10.

S1193: forming a second wiring dielectric layer 903 to cover the surface of the second side of the encapsulation layer 10 and the interconnection line, such as the inter-pillar interconnection line 9011, and forming, in the second wiring dielectric layer 903, a hole of the second wiring dielectric layer which runs through the second wiring dielectric layer 903 and extends to the interconnection line.

S1195: filling the hole of the second wiring dielectric layer with a conductive material, such as metal, to form an interconnection line 9013 for being electrical connected to conductive solder balls and/or bumps 110.

In some embodiments, the hole of the second wiring dielectric layer may be filled with a conductive material, such as metal, to form a pillar-ball interconnection line 9013 that electrically connects the conductive-layer interconnection conductive pillars 130 with the conductive solder balls and/or bumps 110.

In this embodiment, the metal used to fill the hole of the second wiring dielectric layer may be copper. In some embodiments, conductive paste such as nano-silver paste may also be used to fill the hole.

In this embodiment, conductive solder balls and/or bumps 110 may be formed by performing Electroless Nickel Immersion Gold (ENIG) and/or BGA ball placement on the hole of the second wiring dielectric layer.

Next, a method for fabricating a fan-out package structure according to an exemplary embodiment of the present disclosure will be described with reference to FIGS. 6 to 19. FIGS. 6 to 19 are schematic cross-sectional views of intermediate structures and a final structure obtained in the processes of fabricating a fan-out package structure according to exemplary embodiments of the present disclosure.

As shown in FIG. 6, an LCP RF substrate 301 is first obtained, and an antenna array 303 is arranged on a first surface 3011 of the LCP RF substrate 301, and an assembly rewiring layer 150, and a grounding layer and/or an electromagnetic shielding layer 170 are arranged on a second surface 3033 of the LCP RF substrate 301 opposite to the first surface 3011.

Figure 7:
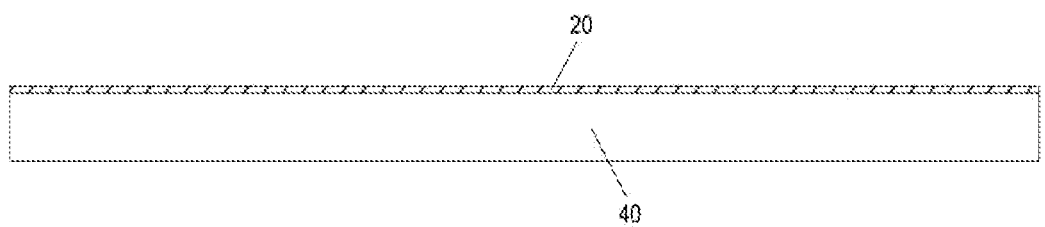

As shown in FIG. 7, a temporary carrier plate 40 or a base material is obtained. A side of the temporary carrier plate 40 or the base material is covered with the peelable adhesive material 20.

Figure 8:
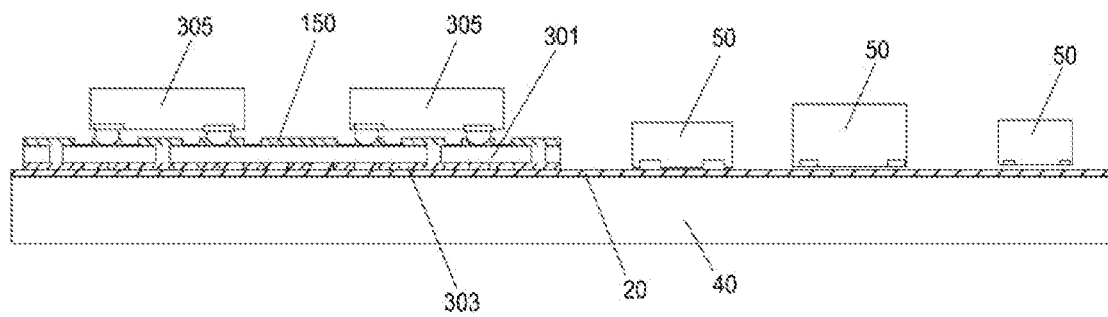

As shown in FIG. 8, one or more RF devices 305 and one or more electronic components 50 are obtained; the side of the LCP substrate where the antenna array is arranged is adhered to the temporary carrier plate 40 via the peelable adhesive material 20; the RF device 305 is mounted on the second surface 3033 of the RF substrate 301 in a flip-chip manner, and the pins of the RF devices 305 are electrically connected to the pins on the second surface 3033 of the RF substrate 301 via the assembly rewiring layer 150; and one or more electronic components 50 are adhered to the temporary carrier plate 40 via the peelable adhesive material 20. In this way, the pins of the antenna RF module assembly 30 which are provided to be located on the same side of the RF substrate 301 as the antenna array 303 and the pins of the electronic components 50 are located in the same plane and connected to the same surface of the temporary carrier plate 40.

Figure 9:
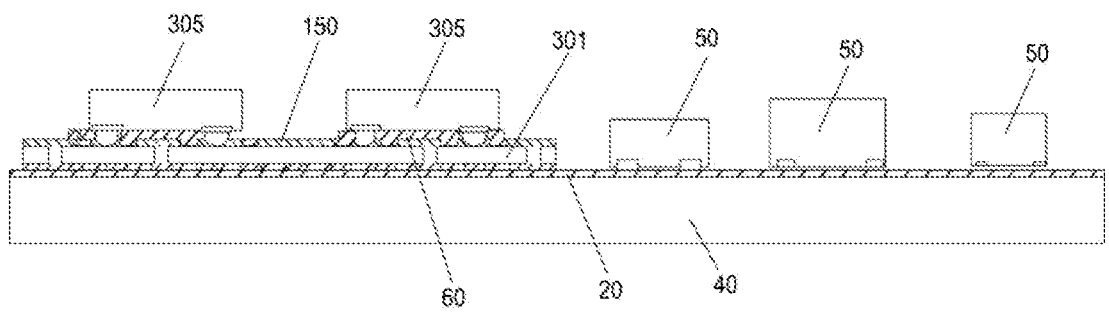

In some embodiments, as shown in FIG. 9, an insulating material layer 60 may be formed by filling an insulating material at the bottoms of the flip-chip RF devices 305 in the structure shown in FIG. 8. Of course, the bottoms of the flip-chip RF devices 305 may not be filled with an insulating material, but the next plastic package may be directly carried out.

Figure 10:
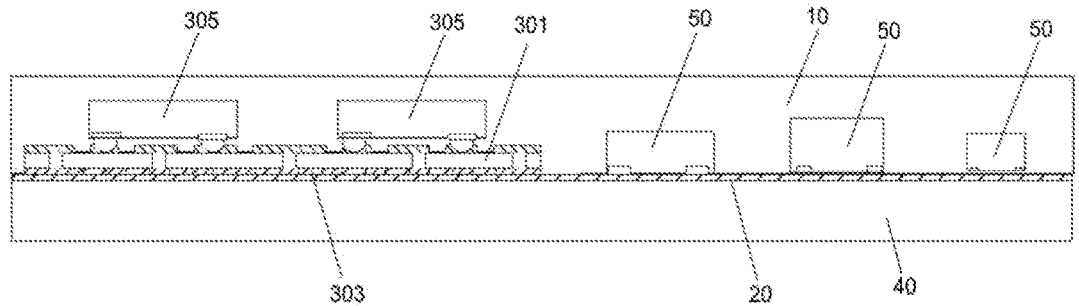

As shown in FIG. 10, the structure shown in FIG. 8 is plastic-packaged with an encapsulation material. Specifically, the encapsulation layer 10 is formed on a side of the temporary carrier plate 40 where the antenna RF module assembly 30 and one or more electronic components 50 are adhered, so that the antenna RF module assembly 30 and the one or more electronic components 50 are embedded in the encapsulation layer 10.

In some embodiments, the encapsulation material may be applied by adopting at least one of transfer molding, die casting molding, jet molding, and vacuum coating. It should be noted that the process of forming the encapsulation material layer is not limited, and those skilled in the art may adopt any suitable other process to obtain the encapsulation material layer as required.

Figure 11:
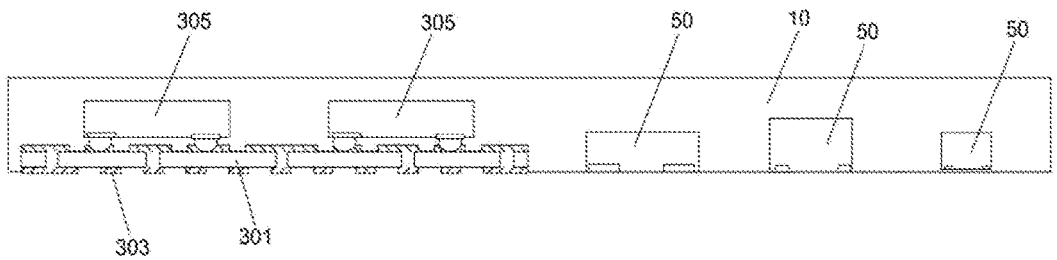

Next, as shown in FIG. 11, the temporary carrier plate 40 and the peelable adhesive material 20 are removed, so that the antenna array 303 is completely exposed from a side of the encapsulation layer 10, and the pins of the antenna RF module assembly 30 which are provided to be located on the same side of the RF substrate 301 as the antenna array 303 and the pins of the electronic components 50 are exposed from the side of the encapsulation layer 10.

Figure 12:
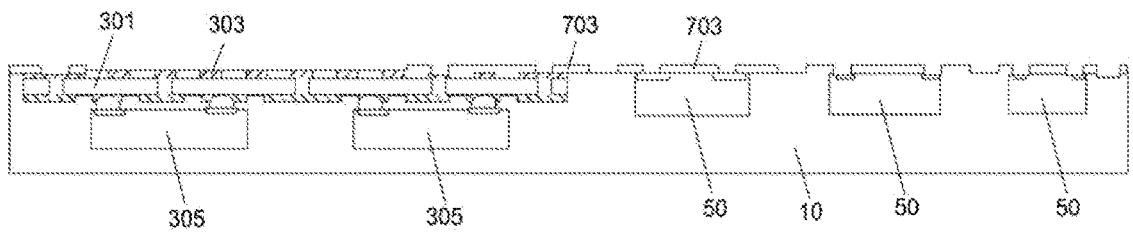
Figure 13:
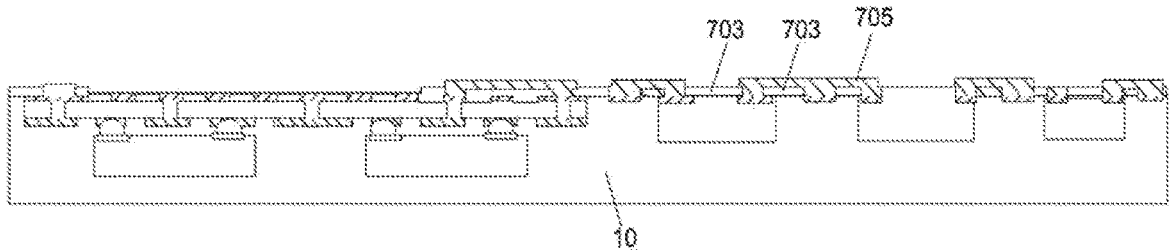
Figure 14:
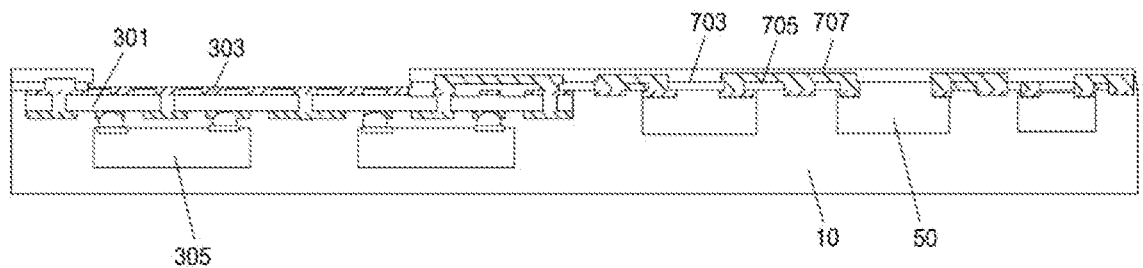

As shown in FIGS. 12 to 14, a first rewiring layer 70 is constructed on the surface of the first side of the encapsulation layer 10. Specifically, referring to FIG. 12, a first wiring dielectric layer 703 is formed adjacent to the encapsulation layer 10, so that the first wiring dielectric layer 703 has an opening that completely exposes the antenna array 303, and the hole of the first wiring dielectric layer that exposes the pins of the antenna RF module assembly 30 which are provided to be located on the same side of the RF substrate 301 as the antenna array 303 and the pins of one or more electronic components 50. Then referring to FIG. 13, the first conductive wiring layer 705 is constructed, wherein the hole of the first wiring dielectric layer is filled with a conductive material, such as metal, to form a guiding conductive pillar, and an antenna-electronic component interconnection line for making the pins of the antenna RF module assembly 30 which are provided to be located on the same side of the RF substrate 301 as the antenna array 303 electrically connected with the pins of one or more electronic components 50, and an inter-electronic component interconnection line for making pins of at least two electronic components 50 electrically connected to each other are formed at the end of the guiding conductive pillar facing away from the encapsulation layer 10. Finally, referring to FIG. 14, the first protective dielectric layer 707 is formed on the side of the first wiring dielectric layer 703 facing away from the encapsulation layer 10 to cover the first conductive wiring layer 705 and a part of the first wiring dielectric layer 703 except the opening that completely exposes the antenna array 303. In other words, in the embodiment of the present disclosure, the first rewiring layer 70 may include a first wiring dielectric layer 703, a first protective dielectric layer 707, and a first conductive wiring layer 705 arranged between them.

Figure 15:
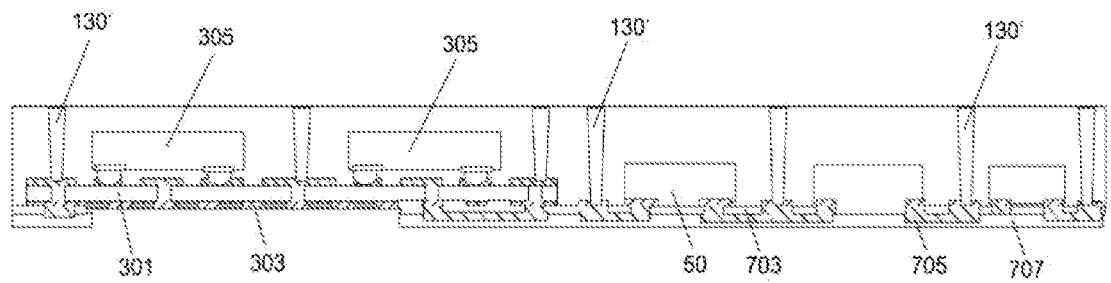

Referring to FIG. 15, the via holes 130' are formed in the encapsulation layer 10 of the structure shown in FIG. 14. The via holes 130' extend from the second side of the encapsulation layer 10 opposite to the first side to the pins of the antenna RF module assembly 30 which are arranged on the side of the RF substrate 301 opposite to the antenna array 303 and/or the conductive pins of the first rewiring layer 70.

Figure 16:
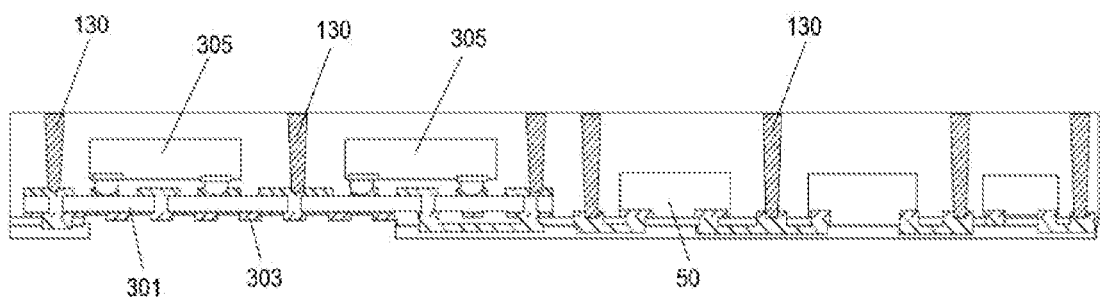

Then, as shown in FIG. 16, the via holes 130' are filled with a conductive material, such as metal, to form encapsulation-layer interconnection conductive pillars 130 in the encapsulation layer 10.

Figure 17:
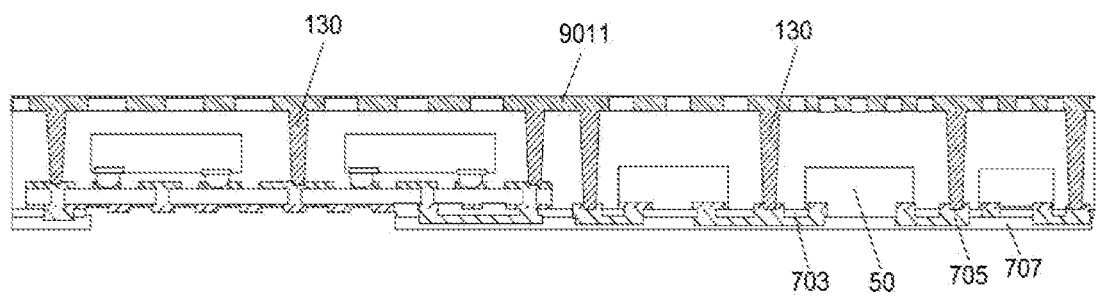
Figure 18:
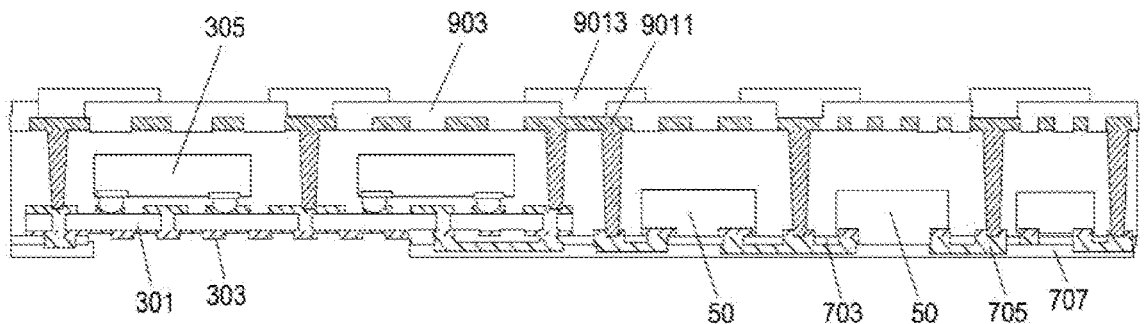

As shown in FIGS. 17 and 18, a second rewiring layer 90 is formed on the surface of the second side of the encapsulation layer 10. Specifically, referring to FIG. 17, an inter-pillar interconnection line 9011 for making the encapsulation-layer interconnection conductive pillars 130 electrically connected to each other is constructed on the surface of the second side of the encapsulation layer 10. Then, referring to FIG. 19, a second wiring dielectric layer 903 is formed to cover the surface of the second side of the encapsulation layer 10 and the inter-pillar interconnection line 9011, a hole of the second wiring dielectric layer running through the second wiring dielectric layer 903 and extending to the inter-pillar interconnection line 9011 is formed in the second wiring dielectric layer 903, and the hole of the second wiring dielectric layer is filled with metal to form a pillar-ball interconnection line 9013 for electrically connecting the encapsulation-layer interconnection conductive pillars 130 to conductive solder balls and/or bumps 110 which are to be fabricated later.

Figure 19:
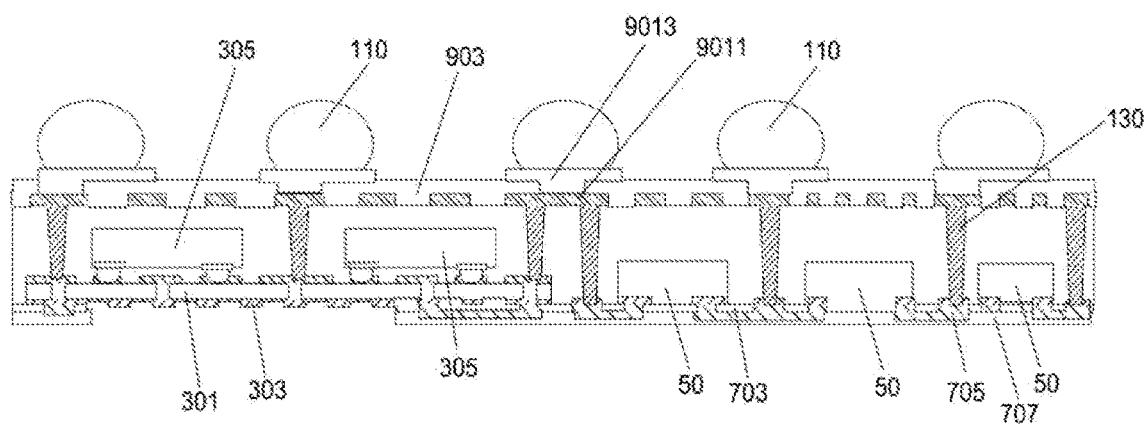

Finally, as shown in FIG. 19, the conductive solder balls and/or bumps 110 may be fabricated by electroplating and/or ball-placing on the pillar-ball interconnection line 9013 (which may also be called external pin pad in some embodiments).

In some embodiments, the formed fan-out package structure may also be cut as required to form a single package device that can be directly used.

It should be noted that the sequence of some fabricating steps in the fabricating flow shown in FIGS. 6 to 19 may be adjusted or even reversed, and the execution sequence of steps is not limited by the sequence of figure numbers.

In the context of the present disclosure, the terms "front", "back", "left", "right", "upper", "lower", "far" and "near", etc. are intended only for convenience of description and should not be regarded as limiting. Although the present disclosure has been described with reference to exemplary embodiments, it should be understood that the present disclosure is not limited to the specific embodiments described and illustrated in detail herein. Those skilled in the art may make various changes to the exemplary embodiments without departing from the scope defined by the Claims of the present disclosure.

The features mentioned and/or illustrated in the above description of the exemplary embodiments of the present disclosure may be combined in one or more other embodiments in the same or similar manner, combined with features in other embodiments, or substituted for corresponding features in other embodiments. These technical solutions obtained by combination or substitution should also be regarded as falling within the scope of protection of the present disclosure.

What is claimed is:

1. A fan-out package structure, comprising: an encapsulation layer, and an antenna radio frequency (RF) module assembly and one or more electronic components embedded in the encapsulation layer, wherein the antenna RF module assembly comprises a RF substrate, and an antenna array and one or more RF devices arranged on the RF substrate, the antenna RF module assembly is embedded in a first side of the encapsulation layer, so that the antenna array is completely exposed from the first side of the encapsulation layer, and pins of the antenna RF module assembly which are provided to be located on a same side of the RF substrate as the antenna array and pins of the one or more electronic components are located in a same plane; and the fan-out package structure further comprises a first rewiring layer provided on a surface of the first side of the encapsulation layer, a second rewiring layer provided on a surface of a second side of the encapsulation layer opposite to the first side, and conductive solder balls and/or bumps provided on a side of the second rewiring layer facing away from the encapsulation layer, wherein the first rewiring layer has an opening configured to completely expose the antenna array, and the first rewiring layer is configured to be electrically connected to at least part of the pins of the antenna RF module assembly which are provided to be located on the same side of the RF substrate as the antenna array and electrically connected to at least part of the pins of the one or more electronic components; encapsulation-layer interconnection conductive pillars configured to make pins of the antenna RF module assembly which are arranged on a side of the RF substrate opposite to the antenna array electrically connected to the second rewiring layer and make the first rewiring layer electrically connected to the second rewiring layer is formed in the encapsulation layer; and the second rewiring layer is configured to be electrically connected to the encapsulation-layer interconnection conductive pillars and electrically connected to the conductive solder balls and/or bumps.

2. The fan-out package structure according to claim 1, wherein the first rewiring layer comprises a first wiring dielectric layer adjacent to the encapsulation layer, a first protective dielectric layer arranged on a side of the first wiring dielectric layer facing away from the encapsulation layer, and a first conductive wiring layer embedded in the first wiring dielectric layer and the first protective dielectric layer, wherein the first conductive wiring layer comprises at least one layer of interconnection line and at least one isolation dielectric layer each located between corresponding two adjacent layers of interconnection lines when two or more layers of interconnection lines are comprised, and the first conductive wiring layer comprises an interconnection line configured to be electrically connected to the encapsulation-layer interconnection conductive pillar, an interconnection line configured to be electrically connected to at least part of the pins of the antenna RF module assembly which are provided to be located on the same side of the RF substrate as the antenna array, and an interconnection line configured to be electrically connected to at least part of the pins of the one or more electronic components; and the second rewiring layer comprises a second wiring dielectric layer, and a second conductive wiring layer embedded in the second wiring dielectric layer and formed to pass through the second wiring dielectric layer, wherein the second conductive wiring layer comprises at least one layer of interconnection line and at least one isolation dielectric layer each located between corresponding two adjacent layers of interconnection lines when two or more layers of interconnection lines are comprised, and the second conductive wiring layer comprises an interconnection line configured to be adjacent to the encapsulation layer and be electrically connected to the encapsulation-layer interconnection conductive pillars, and an interconnection line configured to be electrically connected to the conductive solder balls and/or bumps.

3. The fan-out package structure according to claim 2, wherein the first wiring dielectric layer comprises an antenna-electronic component interconnection line configured to make the pins of the antenna RF module assembly which are provided to be located on the same side of the RF substrate as the antenna array electrically connected to the pins of the one or more electronic components, and an inter-electronic component interconnection line for making pins of at least two electronic components of the one or more electronic components electrically connected to each other.

4. The fan-out package structure according to claim 2, wherein the second conductive wiring layer comprises an inter-pillar interconnection line arranged adjacent to the encapsulation layer and configured to make the encapsulation-layer interconnection conductive pillars electrically connect to each other, and a pillar-ball interconnection line for electrically connecting the encapsulation-layer interconnection conductive pillars to the conductive solder balls and/or bumps.

5. The fan-out package structure according to claim 1, wherein the RF substrate of the antenna RF module assembly comprises a first surface and a second surface opposite to the first surface, and the antenna array is arranged on the first surface and the one or more RF devices are arranged on the second surface.

6. The fan-out package structure according to claim 3, wherein the antenna RF module assembly further comprises one or more assembly rewiring layers arranged between the one or more RF devices and the RF substrate, and the one or more assembly rewiring layers each comprise an assembly conductive wiring layer configured for making the pins of the one or more RF devices electrically connected to pins of the antenna RF module assembly which are arranged on the second surface of the RF substrate.

7. The fan-out package structure according to claim 5, wherein the antenna RF module assembly further comprises a grounding layer and/or an electromagnetic shielding layer arranged on the second surface of the RF substrate.

8. The fan-out package structure according to claim 1, wherein the RF substrate is an LCP RF substrate.

9. The fan-out package structure according to claim 1, wherein the electronic components are each selected from the group consisting of: a passive device, a processor, a memory, a controller, a sensor, and a power management chip; and/or
the RF devices each comprise one or more of a switching device, a power amplifier, a low noise amplifier and a filter.

10. The fan-out package structure according to claim 1, wherein an area of the opening of the first rewiring layer configured to completely expose the antenna array accounts for at least part of a total area of the first rewiring layer.

11. The fan-out package structure according to claim 1, wherein the one or more RF devices are one or more RF chips, and conductive connection parts of the one or more RF chips are arranged on sides of the one or more RF devices facing the RF substrate, so that the one or more RF chips are wire-bonded on the RF substrate.

12. The fan-out package structure according to claim 1, wherein the one or more RF devices are one or more RF chips, and conductive connection parts of the one or more RF chips are arranged on the other side of the one or more RF devices opposite to a side thereof facing the RF substrate, so that the one or more RF chips are flip-chips on the RF substrate.

13. The fan-out package structure according to claim 1, wherein the RF substrate comprises a first surface, a second surface opposite to the first surface, a first layout area arranged on the first surface and configured to layout the one or more RF devices, and a second layout area arranged on the second surface and configured to layout the antenna array.

14. The fan-out package structure according to claim 13, wherein the first layout area is aligned with the second layout area in a vertical direction of the RF substrate, and the vertical direction is perpendicular to a length direction of the RF substrate.

15. A fabricating method for fabricating a fan-out package structure, comprising steps of:
manufacturing an antenna RF module assembly, wherein the antenna RF module assembly comprises a RF substrate, and an antenna array and one or more RF devices arranged on the RF substrate;
providing a temporary carrier plate, and forming a peelable adhesive material on the temporary carrier plate to cover a side of the temporary carrier plate;
sticking a side of the RF substrate where the antenna array is arranged to the peelable adhesive material, so that the antenna RF module assembly is adhered to the temporary carrier plate via the peelable adhesive material;
providing one or more electronic components, and sticking functional surfaces of the one or more electronic components to the temporary carrier plate via the peelable adhesive material, so that pins of the antenna RF module assembly which are provided to be located on a same side of the RF substrate as the antenna array and pins of the one or more electronic components are located in a same plane and connected to a same surface of the temporary carrier plate;
forming an encapsulation layer on a side of the peelable adhesive material facing away from the temporary carrier plate and on a side of the RF substrate where the one or more RF devices are arranged, so as to embed the antenna RF module assembly and the one or more electronic components in the encapsulation layer;
removing the temporary carrier plate and the peelable adhesive material to completely expose the antenna array from a first side of the encapsulation layer, and expose the pins of the antenna RF module assembly which are provided to be located on the same side of the RF substrate as the antenna array and the pins of the one or more electronic components from the first side of the encapsulation layer;
constructing a first rewiring layer on a surface of the first side of the encapsulation layer, wherein the first rewiring layer is provided with an opening configured to completely expose the antenna array, and is configured to be electrically connected to encapsulation-layer interconnection conductive pillars, at least part of the pins of the antenna RF module assembly which are provided to be located on the same side of the RF substrate as the antenna array, and at least part of the pins of the one or more electronic components;
forming via holes in the encapsulation layer, wherein the via holes extend from a second side of the encapsulation layer opposite to the first side to pins of the antenna RF module assembly which are arranged on a side of the RF substrate opposite to the antenna array and/or conductive pins of the first rewiring layer;
filling a conductive material in the via holes to form the encapsulation-layer interconnection conductive pillars in the encapsulation layer; and
constructing a second rewiring layer on a surface of the second side of the encapsulation layer, and forming conductive solder balls and/or bumps on a side of the second rewiring layer facing away from the encapsulation layer, so that the second rewiring layer and the encapsulation-layer interconnection conductive pillars are electrically connected to each other, and are electrically connected to the conductive solder balls and/or bumps.

16. The fabricating method for fabricating a fan-out package structure according to claim 15, wherein the step of constructing a first rewiring layer on a surface of the first side of the encapsulation layer comprises:
forming a first wiring dielectric layer adjacent to the encapsulation layer, so that the first wiring dielectric layer has an opening configured to completely expose the antenna array, and holes of the first wiring dielectric layer configured to expose the pins of the antenna RF module assembly which are provided to be located on the same side of the RF substrate as the antenna array and the pins of the one or more electronic components;
constructing a first conductive wiring layer, wherein the holes of the first wiring dielectric layer is filled with a conductive material to form first guiding conductive pillars, and an interconnection line configured to be electrically connected to the encapsulation-layer interconnection conductive pillars, an interconnection line configured to be electrically connected to at least part of the pins of the antenna RF module assembly which are provided to be located on the same side of the RF substrate as the antenna array, and an interconnection line configured to be electrically connected to at least part of the pins of the one or more electronic components are formed at ends of the first guiding conductive pillars facing away from the encapsulation layer; and forming a first protective dielectric layer on a side of the wiring dielectric layer facing away from the encapsulation layer to cover the first conductive wiring layer and a part of the wiring dielectric layer except the opening configured for completely exposing the antenna array; and the step of constructing the second rewiring layer on the surface of the second side of the encapsulation layer comprises:

constructing an interconnection line configured to be electrically connected to the encapsulation-layer interconnection conductive pillars, on the surface of the second side of the encapsulation layer;

forming a second wiring dielectric layer to cover the surface of the second side of the encapsulation layer and the interconnection line, and forming, in the second wiring dielectric layer, a hole of the second wiring dielectric layer running through the second wiring dielectric layer and extending to the interconnection line; and filling the hole of the second wiring dielectric layer with a conductive material to form an interconnection line configured to be electrically connected to the conductive solder balls and/or bumps.

17. The fabricating method for fabricating a fan-out package structure according to claim 15, wherein the step of manufacturing an antenna RF module assembly comprises steps of:

arranging the antenna array on a first surface of the RF substrate; and arranging the one or more RF devices on a second surface of the RF substrate, wherein the second surface and the first surface are respectively located on opposite sides of the RF substrate, and wherein the step of arranging the one or more RF devices on a second surface of the RF substrate comprises:

constructing one or more assembly rewiring layers between the one or more RF devices and the RF substrate, where the one or more assembly rewiring layers each comprise an assembly conductive wiring layer configured for electrically connecting the pins of the one or more RF devices to the pins of the antenna RF module assembly which are arranged on the second surface of the RF substrate.

18. The fabricating method for fabricating a fan-out package structure according to claim 17, wherein the step of manufacturing an antenna RF module assembly further comprises: forming a grounding layer and/or an electromagnetic shielding layer on the second surface of the RF substrate.

19. The fabricating method for fabricating a fan-out package structure according to claim 15, wherein the step of manufacturing an antenna RF module assembly further comprises providing an LCP RF substrate as the RF substrate of the antenna RF module assembly.

20. The fabricating method for fabricating a fan-out package structure according to claim 15, wherein the electronic component is selected from: a passive device, a processor, a memory, a controller, a sensor, and a power management chip; and/or the RF device comprises one or more of a switching device, a power amplifier, a low noise amplifier and a filter.

* * * * *